US012680019B2

(12) United States Patent
Feng

(10) Patent No.: US 12,680,019 B2
(45) Date of Patent: Jul. 14, 2026

(54) QUANTUM DOT AND PREPARATION METHOD THEREFOR, QUANTUM DOT LIGHT-EMITTING DEVICE, AND DISPLAY APPARATUS

(71) Applicant: BOE Technology Group Co., Ltd., Beijing (CN)

(72) Inventor: Jingwen Feng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 457 days.

(21) Appl. No.: 18/034,364

(22) PCT Filed: Dec. 9, 2020

(86) PCT No.: PCT/CN2020/135007
§ 371 (c)(1),
(2) Date: Apr. 27, 2023

(87) PCT Pub. No.: WO2022/120655
PCT Pub. Date: Jun. 16, 2022

(65) Prior Publication Data
US 2023/0383178 A1      Nov. 30, 2023

(51) Int. Cl.
| | |
|---|---|
| *C09K 11/08* | (2006.01) |
| *B82Y 20/00* | (2011.01) |
| *B82Y 40/00* | (2011.01) |
| *C09K 11/02* | (2006.01) |
| *C09K 11/70* | (2006.01) |
| *H10K 50/115* | (2023.01) |
| *H10K 71/00* | (2023.01) |

(52) U.S. Cl.
CPC ........ *C09K 11/0883* (2013.01); *C09K 11/025* (2013.01); *C09K 11/703* (2013.01); *H10K 50/115* (2023.02); *B82Y 20/00* (2013.01); *B82Y 40/00* (2013.01); *H10K 71/00* (2023.02)

(58) Field of Classification Search
CPC .... C09K 11/703; H10K 50/115; B82Y 20/00; B82Y 40/00
See application file for complete search history.

(56) References Cited

U.S. PATENT DOCUMENTS

| | | | |
|---|---|---|---|
| 9,768,404 B1 | 9/2017 | Steckel et al. | |
| 2010/0032645 A1* | 2/2010 | Choi ..................... | H05B 33/10 257/E51.027 |

(Continued)

FOREIGN PATENT DOCUMENTS

| | | |
|---|---|---|
| CN | 106848079 A | 6/2017 |
| CN | 108682752 A | 10/2018 |
| CN | 110085757 A | 8/2019 |

OTHER PUBLICATIONS

CN202080003260.8 first office action.
CN202080003260.8 second office action.
PCT/CN2020/135007 international search report.

*Primary Examiner* — Brian Turner
(74) *Attorney, Agent, or Firm* — IPro, PLLC

(57) ABSTRACT

Disclosed are a quantum dot and a preparation method therefor, a quantum dot light-emitting device, and a display apparatus. The quantum dot includes a core structure and a shell structure that surrounds the core structure, wherein the material of the outermost shell in the shell structure includes an electron transport material and a hole transport material.

20 Claims, 6 Drawing Sheets

(56)               References Cited

U.S. PATENT DOCUMENTS

| | | |
|---|---|---|
| 2016/0233449 A1* | 8/2016 | Murayama ........... C09K 11/565 |
| 2017/0271605 A1 | 9/2017 | Steckel et al. |
| 2018/0019371 A1 | 1/2018 | Steckel et al. |
| 2018/0122869 A1* | 5/2018 | Jiang ................ G02F 1/133621 |
| 2021/0104696 A1* | 4/2021 | Park ................... H10K 85/1135 |
| 2021/0135138 A1* | 5/2021 | Kim ..................... C09K 11/883 |
| 2022/0298411 A1* | 9/2022 | Kossoy ................. C09K 11/54 |

* cited by examiner

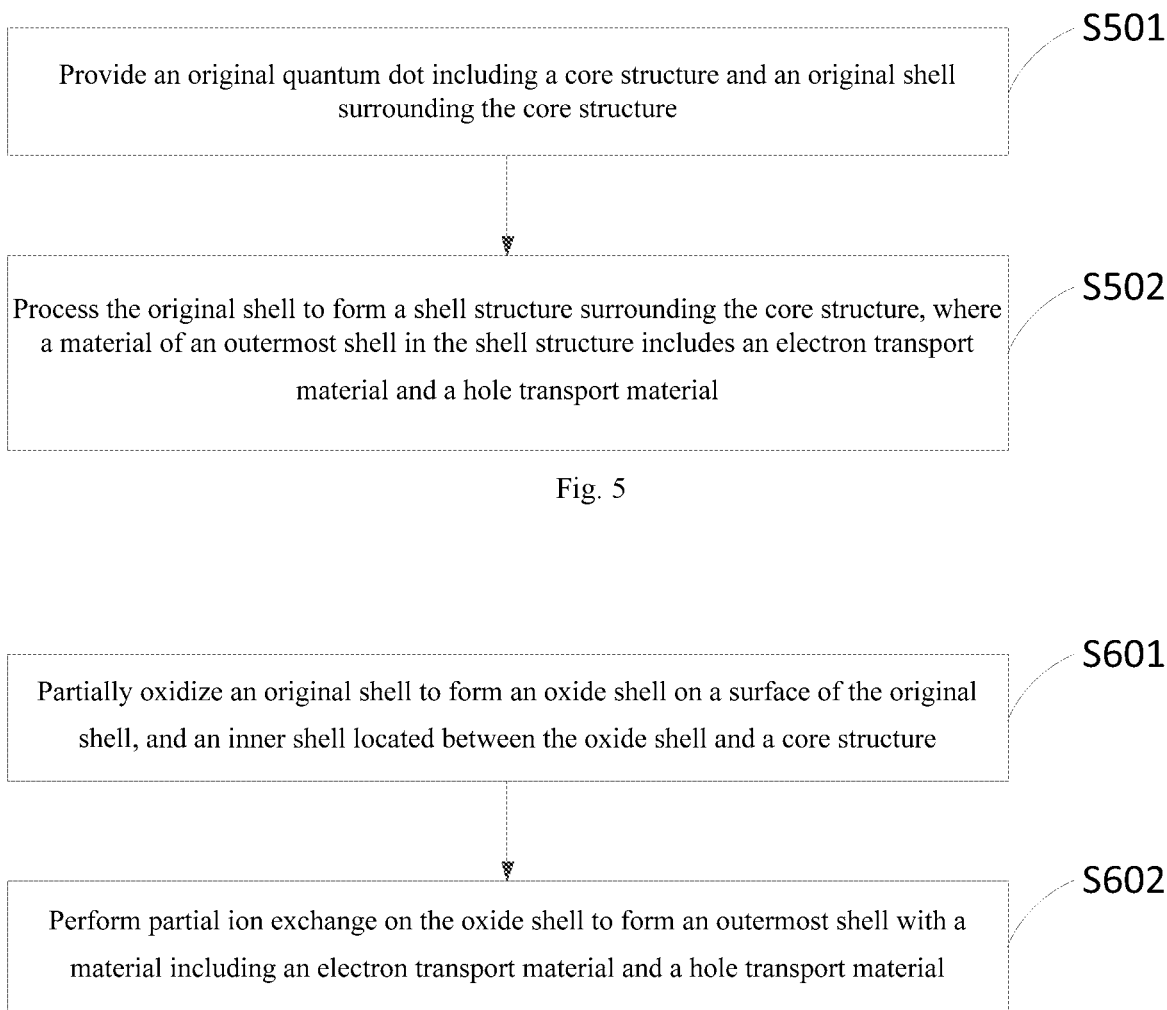

S501

Provide an original quantum dot including a core structure and an original shell surrounding the core structure

S502

Process the original shell to form a shell structure surrounding the core structure, where a material of an outermost shell in the shell structure includes an electron transport material and a hole transport material

Partially oxidize an original shell to form an oxide shell on a surface of the original shell, and an inner shell located between the oxide shell and a core structure

S602

Perform partial ion exchange on the oxide shell to form an outermost shell with a material including an electron transport material and a hole transport material

QUANTUM DOT AND PREPARATION METHOD THEREFOR, QUANTUM DOT LIGHT-EMITTING DEVICE, AND DISPLAY APPARATUS

This application is a National Stage of International Application No. PCT/CN2020/135007, filed on Dec. 9, 2020, which is hereby incorporated by reference in its entirety.

FIELD

The present disclosure relates to the technical field of display, and particularly to a quantum dot and a preparation method therefor, a quantum dot light-emitting device, and a display apparatus.

BACKGROUND

Quantum dots (QDs), also known as semiconductor nanocrystals and semiconductor nanoparticles, refer to nanosolid materials that have dimensions in the order of nanometers in three dimensions of space, or a nano-solid material composed of QDs as basic units is a collection of atoms and molecules on a nanoscale. A light-emitting diode based on a quantum dot material is called a quantum dot light-emitting diode (QLED), and is a novel light-emitting device.

In the QLED device, functional layers include a hole injection layer, a hole transport layer, a quantum dot light-emitting layer, and an electron transport layer. Selecting a suitable device structure to be matched with transmission characteristics of each functional layer is crucial to performance of the QLED device. At present, introduction of a material ZnO of the electron transport layer makes electron transport more efficient, thereby making electrons become majority carriers in the QLED device. However, due to a deep valence band of the quantum dots, a hole transport material often cannot ensure sufficient hole injection, which leads to uneven injection of electrons and holes, affecting both efficiency and service life of the QLED device.

In addition, preparation of more functional layers above increases complexity of a process and uncontrollability in a preparation process. Moreover, in the preparation process of the more functional layers, interaction between solvents is also a key factor affecting the performance of the device.

SUMMARY

A quantum dot provided by an embodiment of the present disclosure includes a core structure and a shell structure surrounding the core structure, where a material of an outermost shell in the shell structure includes an electron transport material and a hole transport material.

Optionally, in the above quantum dot provided by an embodiment of the present disclosure, the shell structure includes the outermost shell and an inner shell located between the outermost shell and the core structure.

Optionally, in the above quantum dot provided by an embodiment of the present disclosure, a material of the inner shell includes a binary compound semiconductor material.

Optionally, in the above quantum dot provided by an embodiment of the present disclosure, the material of the inner shell includes one or a combination of ZnS, ZnSe, CdS or CdSe.

Optionally, in the above quantum dot provided by an embodiment of the present disclosure, the outermost shell includes a plurality of electron transport material grains and a plurality of hole transport material grains, and the electron transport material grains and the hole transport material grains are dispersed and spaced with each other.

Optionally, in the above quantum dot provided by an embodiment of the present disclosure, the electron transport material and the hole transport material included by the outermost shell are distributed independent of each other.

Optionally, in the above quantum dot provided by an embodiment of the present disclosure, the electron transport material is an inorganic material, and/or, the hole transport material is an inorganic material.

Optionally, in the above quantum dot provided by an embodiment of the present disclosure, when the electron transport material is the inorganic material, the electron transport material includes one or a combination of ZnO, $Al_2O_3$, $TiO_2$, $ZrO_2$, $SnO_2$, $Nb_2O_5$, or $In_2O_3$; and/or, when the hole transport material is the inorganic material, the hole transport material includes one or a combination of $NiO_x$, $WO_x$, $MoO_x$, $VO_x$ or $CrO_x$.

Optionally, in the above quantum dot provided by an embodiment of the present disclosure, a thickness of the outermost shell is 1 nm to 100 nm.

Accordingly, an embodiment of the present disclosure further provides a quantum dot light-emitting device, including an anode, a hole injection layer, a quantum dot light-emitting layer and a cathode arranged sequentially in a stacked mode, where the quantum dot light-emitting layer includes the above quantum dot.

Optionally, in the above quantum dot light-emitting device provided by an embodiment of the present disclosure, the hole injection layer is in direct contact with the quantum dot light-emitting layer.

Accordingly, an embodiment of the present disclosure further provides a display apparatus, including the above quantum dot light-emitting device.

Accordingly, an embodiment of the present disclosure further provides a preparation method for a quantum dot, including:

providing an original quantum dot including a core structure and an original shell surrounding the core structure; and processing the original shell to form a shell structure surrounding the core structure; wherein a material of an outermost shell in the shell structure includes an electron transport material and a hole transport material.

Optionally, in the above preparation method provided by an embodiment of the present disclosure, the processing the original shell to form the shell structure surrounding the core structure includes:

partially oxidizing the original shell to form an oxide shell on a surface of the original shell, and an inner shell located between the oxide shell and the core structure; and performing partial ion exchange on the oxide shell to form the outermost shell with the material including the electron transport material and the hole transport material.

Optionally, in the above preparation method provided by an embodiment of the present disclosure, the performing partial ion exchange on the oxide shell includes:

introducing an exchange reagent of a cation and a ligand into a solution of the quantum dot including the oxide shell to achieve partial ion exchange through strength of a coordination capability between the ligand and the cation.

BRIEF DESCRIPTION OF THE DRAWINGS

FIG. 5 is a flow diagram of a preparation method for a quantum dot provided by an embodiment of the present disclosure.

FIG. 6 is a flow diagram of another preparation method for a quantum dot provided by an embodiment of the present disclosure.

DETAILED DESCRIPTION OF EMBODIMENTS

In order to make objectives, technical solutions and advantages of embodiments of the present disclosure clearer, the technical solutions of embodiments of the present disclosure will be described below clearly and completely with reference to accompanying drawings of embodiments of the present disclosure. Apparently, the described embodiments are part of embodiments of the present disclosure, not all of them. Embodiments in the present disclosure and features in embodiments may be mutually combined in the case of no conflict. On the basis of the described embodiments of the present disclosure, all other embodiments obtained by those ordinarily skilled in the art without inventive efforts fall within the scope of protection of the present disclosure.

Unless otherwise defined, technical or scientific terms used in the present disclosure shall have the usual meanings understood by those ordinarily skilled in the art to which the present disclosure pertains. The words "including" or "comprising" and the like used in the present disclosure mean that an element or item preceding the word covers an element or item listed after the word and the equivalent thereof, without excluding other elements or items. "Connection" or "connected" and similar words are not limited to physical or mechanical connection, but may include electrical connection, whether direct or indirect. The words "inner", "outer", "up", "down" and the like are only used to indicate the relative positional relationship. When the absolute position of the described object changes, the relative positional relationship may also change accordingly.

It should be noted that sizes and shapes of all figures in the accompanying drawings do not reflect a true scale, and only intend to illustrate the content of the present disclosure. The same or similar reference numbers represent the same or similar elements or elements with the same or similar functions from beginning to end.

Figure 1:
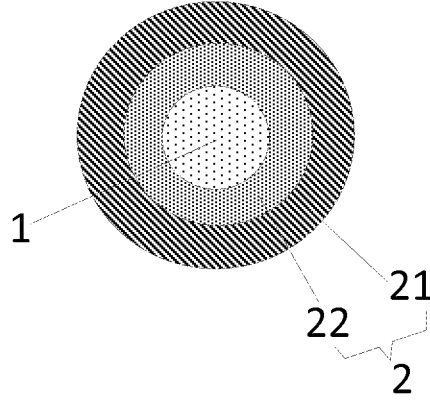
FIG. 1 is a schematic structural diagram of a quantum dot provided by an embodiment of the present disclosure.

A quantum dot provided by an embodiment of the present disclosure, as shown in FIG. 1, includes a core structure 1 and a shell structure 2 surrounding the core structure 1. A material of an outermost shell 21 in the shell structure 2 includes an electron transport material and a hole transport material.

The quantum dot of a core-shell structure provided by an embodiment of the present disclosure can be applied to preparation of a QLED device because the material of the outermost shell of the quantum dot includes the electron transport material and the hole transport material. On the one hand, an outermost electron transport material of the quantum dot may be used as an electron transport layer in the QLED device, and an outermost hole transport material of the quantum dot may be used as a hole transport layer in the QLED device, thereby reducing a process of making the electron transport layer and the hole transport layer separately, effectively simplifying a device structure and process, and avoiding damage to a previous film layer by a next film layer in a solution process. On the other hand, both the electron transport material and the hole transport material are in close contact with the quantum dot, thereby making injection of electrons and holes more efficient and effectively avoiding charge loss. In addition, the electron transport material and the hole transport material simultaneously make contact with a hole injection layer in the QLED device, but the holes may be preferentially injected into the hole transport material with a smaller potential barrier difference value, and then further injected into the quantum dot. Therefore, the outer-layer electron transport material may not block injection of the holes. Similarly, the electrons may be preferentially injected into the electron transport material with a smaller potential barrier difference value, and then further injected into the quantum dot. Therefore, the outer-layer hole transport material may not hinder injection of the electrons. In addition, injection efficiency of the electrons and the holes during work of the device may be flexibly adjusted by adjusting components of the electron transport material and the hole transport material, so that injection of the electrons and the holes is more balanced, thereby improving the efficiency of the device and prolonging the service life of the device.

An embodiment of the present disclosure directly designs the outermost shell of the quantum dot to include the electron transport material and the hole transport material, so that the electron transport material and the hole transport material make better contact with the quantum dot, which is more conducive to injection of the electrons and the holes.

Further, during specific implementation, in the above quantum dot provided by an embodiment of the present disclosure, as shown in FIG. 1, the shell structure 2 includes the outermost shell 21, and an inner shell 22 located between the outermost shell 21 and the core structure 1. There may be one, two or a plurality of inner shells 22. Because compared to a quantum dot with only the core structure, a quantum dot of a core@shell structure has fewer defect centers on the surface, and has higher light-emitting efficiency, currently, the core@shell structure and a core@shell@shell structure are widely used. Certainly, quantum dots with different shell structures may be formed according to light-emitting requirements, and as long as the material of the outermost shell of the quantum dot includes the electron transport material and the hole transport material, the quantum dot belongs to the quantum dot structure protected by the present disclosure.

During specific implementation, in the above quantum dot provided by an embodiment of the present disclosure, a material of the inner shell may include a binary compound semiconductor material. In some embodiments, the inner shell may be a structural feature formed by an original shell of the quantum dot through an oxidation reaction and a subsequent ion exchange reaction, and the original shell includes the binary compound semiconductor material. The outermost shell is formed by the original shell of the quantum dot through the oxidation reaction and the subsequent ion exchange reaction. However, the oxidation reaction does not completely oxidize the original shell, and a shell of the original shell that has not undergone the oxidation reaction becomes the inner shell. The above mode of forming the inner shell is beneficial to saving process cost.

Optionally, the material of the inner shell is generally a semiconductor material with a wide band gap. The semiconductor material with a wide band gap has a quantum confinement effect, so that the electrons and the holes may be confined within the core structure of the quantum dot, and the electrons and the holes are compounded in the core structure to emit light. For example, a band gap of a ZnS material is 3.6 ev, a band gap of a ZnSe material is 2.70 eV, a band gap of a CdS material is 2.4 ev, and a band gap of a CdSe material is 1.80 eV.

Further, during specific implementation, in the above quantum dot provided by an embodiment of the present disclosure, the material of the inner shell includes, but is not limited to, one or a combination of ZnS, ZnSe, CdS or CdSe. When there is one inner shell, the inner shell may be ZnS, ZnSe, CdS, CdSe or the like. When there are two inner shells, the inner shells may be a combination of any two layers of ZnS, ZnSe, CdS, CdSe or the like, such as ZnS@ZnSe and ZnS@CdS. When there are three inner shells, the inner shells may be a combination of any three layers of ZnS, ZnSe, CdS, CdSe or the like, such as ZnS@ZnS@CdS and ZnS@CdS@CdSe, and so on.

In one possible implementation, the core structure and the inner shell, as well as the inner shell and an outer shell of the quantum dot of the core-shell structure, may be bonded by covalent bonds.

Figure 2:
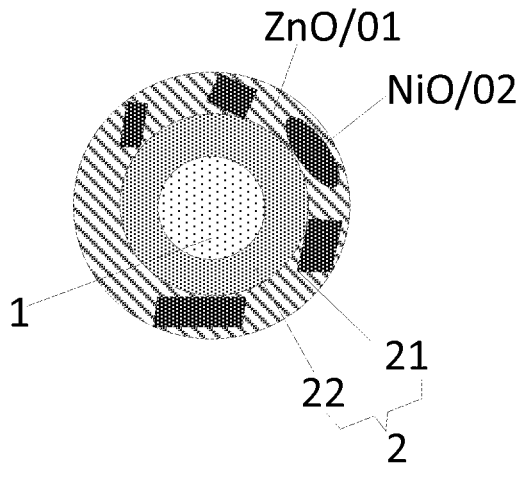
FIG. 2 is a specific schematic structural diagram of a quantum dot provided by an embodiment of the present disclosure.

In one possible implementation, in the above quantum dot provided by an embodiment of the present disclosure, as shown in FIG. 2, the outermost shell 21 includes a plurality of electron transport material grains 01 and a plurality of hole transport material grains 02, and the electron transport material grains 01 and the hole transport material grains 02 are dispersed and spaced with each other.

Figure 3:
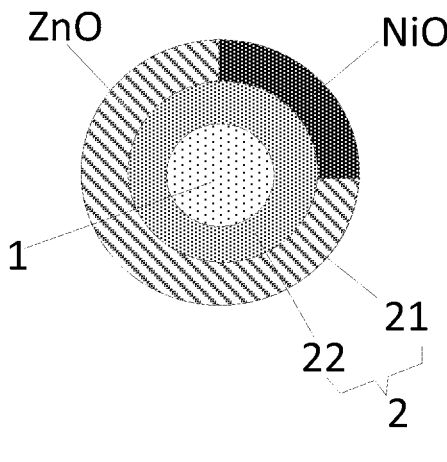
FIG. 3 is a specific schematic structural diagram of another quantum dot provided by an embodiment of the present disclosure.
Figure 4:
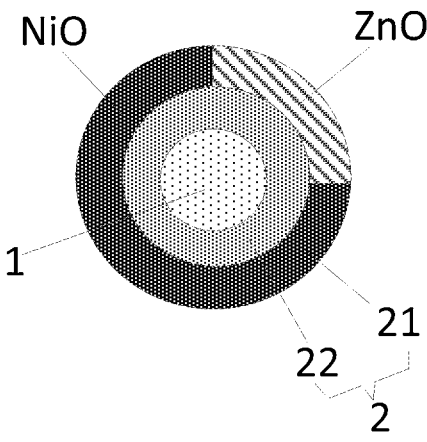
FIG. 4 is a specific schematic structural diagram of yet another quantum dot provided by an embodiment of the present disclosure.

In one possible implementation, in the above quantum dot provided by an embodiment of the present disclosure, as shown in FIG. 3 and FIG. 4, the electron transport material (such as ZnO) and the hole transport material (such as NiO) included by the outermost shell 21 are distributed independent of each other. That is, the electron transport materials (such as ZnO) are distributed together, and the hole transport materials (such as NiO) are distributed together. A component ratio of the electron transport material to the hole transport material may be flexibly adjusted. For example, in FIG. 3, there are more electron transport materials (such as ZnO) than the hole transport materials (such as NiO); and in FIG. 4, there are more hole transport materials (such as NiO) than the electron transport materials (such as ZnO).

Further, during specific implementation, in the above quantum dot provided by an embodiment of the present disclosure, the semiconductor material used for the core structure includes, but is not limited to, group II-VI compounds, group III-V compounds, group IV-VI compounds, or group I-IV-VII compounds. The core structure may be CdS, CdSe, CdTe, InP, PbS, $CsPbCl_3$, $CsPbBr_3$, $CsPhI_3$, and other binary, ternary, and quaternary compounds.

During specific implementation, in the above quantum dot provided by an embodiment of the present disclosure, the electron transport material may be selected from an inorganic material with an electron transport capability, and/or, the hole transport material may be selected from an inorganic material with a hole transport capability.

Further, during specific implementation, in the above quantum dot provided by an embodiment of the present disclosure, when the electron transport material is selected from the inorganic material, the electron transport material may be a metal oxide or a metal composite oxide. The metal oxide is, for example, ZnO, $Al_2O_3$, $TiO_2$, $ZrO_2$, $SnO_2$, $Nb_2O_5$ or $In_2O_3$, and the metal composite oxide is, for example, ZnMgO.

Further, during specific implementation, in the above quantum dot provided by an embodiment of the present disclosure, when the hole transport material is selected from the inorganic material, the hole transport material includes, but is not limited to, one or a combination of NiOx, WOx, MoOx, VOx, or CrOx.

During specific implementations, a ratio of the electron transport material to the hole transport material directly affects the balance of injection of the electrons and the holes, and the component ratio of the electron transport material to the hole transport material may be adjusted and controlled according to actual requirements. By adjusting the ratio of the electron transport material to the hole transport material, a difference value between the quantity of electrons and the quantity of holes that reach the core structure per unit time is within a preset threshold range, to achieve expected light-emitting efficiency. Further, when the quantity of the electrons reaching the core structure per unit time is greater than the quantity of the holes, and the difference value between the quantity of the electrons and the quantity of the holes that reach the core structure per unit time exceeds the preset threshold range, the ratio of the hole transport material may be increased, so that the difference value between the quantity of the electrons and the quantity of the holes that reach the core structure per unit time is within the preset threshold range. When the quantity of the electrons reaching the core structure per unit time is less than the quantity of the holes, and the difference value between the quantity of the electrons and the quantity of the holes that reach the core structure per unit time exceeds the preset threshold range, the ratio of the electron transport material may be increased, so that the difference value between the quantity of the electrons and the quantity of the holes that reach the core structure per unit time is within the preset threshold range.

Since the electrons and the holes are injected into the core structure of the quantum dot respectively from a cathode and an anode through the outermost shell and the inner shell, a thickness of the inner shell may affect injection of the electrons and the holes. If the inner shell is too thick, injection of the electrons and the holes is weakened. Therefore, in order to ensure the light-emitting efficiency of the quantum dot, the electron transport capability of the electron transport material, and the hole transport capability of the hole transport material, in the above quantum dot provided in an embodiment of the present disclosure, the thickness of the inner shell may be 1 nm to 10 nm, and a thickness of the outermost shell may be 1 nm to 100 nm.

The quantum dot in an embodiment of the present disclosure includes, but is not limited to, CdS@ZnS@NiO/ZnO, CdSe@ZnS@NiO/ZnO, InP@ZnS@NiO/ZnO, PbS@ZnS@NiO/ZnO, CsPbCl$_3$@ZnS@NiO/ZnO, CsPbBr$_3$@ZnS@NiO/ZnO, CsPhI$_3$@ZnS@NiO/ZnO, CdS@ZnS@WO$_3$/ZnO, CdSe@ZnS@WO$_3$/ZnO, CdS@ZnS@NiO/Al$_2$O$_3$, InP@ZnS@NiO/Al$_2$O$_3$ and other quantum dots. The ratio of the electron transport material to the hole transport material in the outermost shell may be any value, and the ratio of the electron transport material to the hole transport material is selected according to the requirement for balance of injection of the electrons and the holes.

Further, during specific implementation, an embodiment of the present disclosure is illustrated by taking examples of an InP@ZnS@ZnO/NiO quantum dot with a core structure being InP, an inner shell being a layer of ZnS, an electron transport material of an outermost shell being ZnO and a hole transport material of the outermost shell being NiO, and a CdSe@ZnS@ZnO/NiO quantum dot with a core structure being CdSe, an inner shell being a layer of ZnS, an electron transport material of an outermost shell being ZnO and the hole transport material of the outermost shell being NiO.

Based on the same inventive concept, an embodiment of the present disclosure further provides a preparation method for the above quantum dot provided by an embodiment of the present disclosure, as shown in FIG. 5, including following steps.

S501, an original quantum dot including a core structure and an original shell surrounding the core structure is provided. For example, the original quantum dot is CdSe@ZnS or InP@ZnS, where CdSe and InP are the core structures of the corresponding quantum dot, and ZnS is the original shell of the corresponding quantum dot.

S502, the original shell is processed to form a shell structure surrounding the core structure; where a material of an outermost shell in the shell structure includes an electron transport material and a hole transport material. For example, the original shell ZnS of the original quantum dot InP@ZnS is processed to form the shell structure 2 surrounding the core structure InP, and the material of the outermost shell 21 in the shell structure 2 includes the electron transport material and the hole transport material.

According to the preparation method for the above quantum dot provided by an embodiment of the present disclosure, the outermost shell of the quantum dot prepared by adopting the above preparation method includes the electron transport material and the hole transport material, in this way, the quantum dot with this structure can be applied to preparation of a QLED device. On the one hand, an outermost electron transport material of the quantum dot may be used as an electron transport layer in the QLED device, and an outermost hole transport material of the quantum dot may be used as a hole transport layer in the QLED device, thereby reducing a process of making the electron transport layer and the hole transport layer separately, effectively simplifying a device structure and process, and avoiding damage to a previous film layer by a next film layer in a solution process. On the other hand, both the electron transport material and the hole transport material are in close contact with the quantum dot, thereby making injection of electrons and holes more efficient and effectively avoiding charge loss. In addition, the electron transport material and the hole transport material simultaneously make contact with the hole injection layer in the QLED device, but the holes may be preferentially injected into the hole transport material with a smaller potential barrier difference value, and then further injected into the quantum dot. Therefore, the outer-layer electron transport material may not block injection of the holes. Similarly, the electrons may be preferentially injected into the electron transport material with a smaller potential barrier difference value, and then further injected into the quantum dot. Therefore, the outer-layer hole transport material may not hinder injection of the electrons. In addition, injection efficiency of the electrons and the holes during work of the device may be flexibly adjusted by adjusting components of the electron transport material and the hole transport material, so that injection of the electrons and the holes is more balanced, thereby improving the efficiency of the device and prolonging the service life of the device.

Further, during specific implementation, in the above preparation method for the quantum dot provided by an embodiment of the present disclosure, the processing the original shell to form the shell structure surrounding the core structure, as shown in FIG. 6, includes following steps.

S601, the original shell is partially oxidized to form an oxide shell on a surface of the original shell, and an inner shell located between the oxide shell and the core structure.

For example, the original shell ZnS of the original quantum dot InP@ZnS is partially oxidized to form the oxide shell ZnO on the surface of the original shell ZnS, and the inner shell ZnS (the inner shell ZnS is a remaining unoxidized portion of the original shell) located between the oxide shell ZnO and the core structure InP, that is, an InP@ZnS@ZnO quantum dot is formed, and ZnO may be used as the electron transport material.

S602, partial ion exchange is performed on the oxide shell to form an outermost shell with a material including an electron transport material and a hole transport material.

For example, an exchange reagent a cation (the cation used as the hole transport material) is used to exchange part of Zn$^{2+}$ in the oxide shell ZnO, thereby forming the outermost shell with the material including the electron transport material and the hole transport material.

Further, during specific implementation, in the above preparation method for the quantum dot provided by an embodiment of the present disclosure, the partially oxidizing the original shell includes a following step.

O$_2$ or H$_2$O$_2$ is introduced into a solution of an original quantum dot. For example, O$_2$ or H$_2$O$_2$ is introduced into a solution of an InP@ZnS core-shell quantum dot, so that the original shell ZnS is partially oxidized into ZnO, to form a quantum dot of an InP@ZnS@ZnO structure.

Further, during specific implementation, in the above preparation method for the quantum dot provided by an embodiment of the present disclosure, the performing partial ion exchange on the oxide shell includes a following step.

An exchange reagent of a cation and a ligand are introduced into a solution of the quantum dot including the oxide shell to achieve partial ion exchange through strength of a coordination capability between the ligand and the cation.

The exchange reagent of the cation may be nickel chloride hexahydrate, nickel sulfate hexahydrate, tungsten hexachloride, or the like, and the ligand may be a tributyl phosphine (PDT) or trinoctylphosphine oxide ligand (TOPO), or the like. For example, ion exchange reagents such as nickel chloride hexahydrate, nickel sulfate hexahydrate or tungsten hexachloride, and the ligand such as the tributyl phosphine (PDT) or trinoctylphosphine oxide ligand (TOPO) are added into the solution of the quantum dot InP@ZnS@ZnO, partial ion exchange is achieved through the strength of the coordination capability between the ligand and the ion to obtain an InP@ZnS@ZnO/XO (X=Ni, W, etc.) quantum dot with the outermost shell including the electron transport material and the hole transport material. For example, the nickel chloride hexahydrate (NiCl$_2$·6H$_2$O) ion exchange reagent and the tributyl phosphine (PDT) ligand are added into the InP@ZnS@ZnO solution, because a coordination capability of PDT with $Zn^{2+}$ is higher than a coordination capability of PDT with $Ni^{2+}$, PDT coordinates with $Zn^{2+}$ to form a coordination compound. By controlling reaction time and the addition amount of the nickel chloride hexahydrate ($NiCl_2 \cdot 6H_2O$) ion exchange agent, $Ni^{2+}$ occupies positions of part of $Zn^{2+}$ in the ZnO shell, to form the outermost shell with the material including the electron transport material ZnO and the hole transport material NiO, namely, to obtain the InP@ZnS@ZnO/NiO quantum dot.

It is worth noting that the ratio of the electron transport material to the hole transport material in the outermost shell may be adjusted by adjusting the amount of the cation exchange reagent and the ligand added during an ion exchange reaction and the reaction time.

The above preparation method for the quantum dot provided by an embodiment of the present disclosure is illustrated in detail below by taking an example of preparing the InP@ZnS@NiO quantum dot.

(1) the InP@ZnS core-shell quantum dot is formed; and the InP@ZnS core-shell quantum dot may be formed by but not limited to a solution phase synthesis method, a hydrothermal method, a solvothermal method, and other methods.

(2) $O_2$ is introduced into or $H_2O_2$ is added into a solution of the InP@ZnS core-shell quantum dot, so that the quantum dot shell ZnS is partially oxidized into ZnO, to form the quantum dot of the InP@ZnS@ZnO structure.

(3) the nickel chloride hexahydrate ($NiCl_2 \cdot 6H_2O$) ion exchange reagent and the tributyl phosphine (PDT) ligand are added into the solution of InP@ZnS@ZnO, because the coordination capability of PDT with $Zn^{2+}$ is greater than the coordination capability of PDT with $Ni^{2+}$, PDT coordinates with $Zn^{2+}$ to form the coordination compound. By controlling the reaction time and the addition amount of the nickel chloride hexahydrate ($NiCl_2 \cdot 6H_2O$) ion exchange agent, $Ni^{2+}$ occupies the positions of part of $Zn^{2+}$ in the ZnO shell, to form the outermost shell with the material including the electron transport material ZnO and the inorganic hole transport material NiO, namely, to obtain the InP@ZnS@ZnO/NiO quantum dot.

Figure 7:
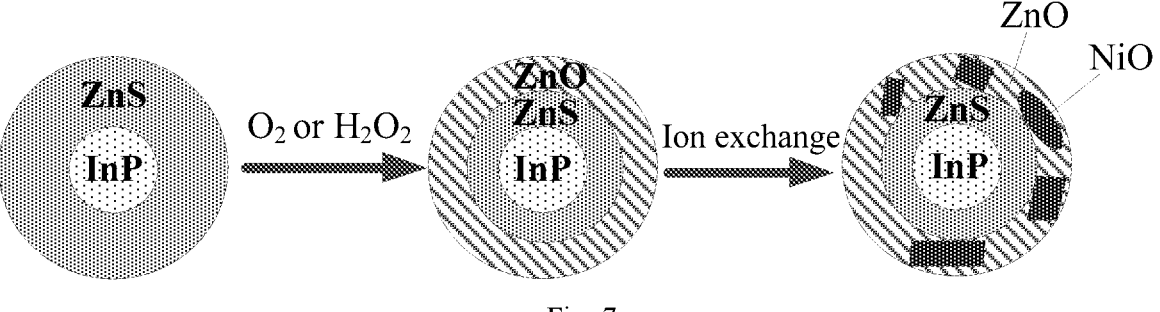
FIG. 7 is a schematic structural diagram of each step of a preparation method for a quantum dot provided by an embodiment of the present disclosure.

The above quantum dot provided by an embodiment of the present disclosure may be prepared through step (1) to step (3) above. The specific schematic flow diagram of preparation of the quantum dot is shown in FIG. 7.

A preparation method for a CdSe@ZnS@NiO quantum dot is the same as the above preparation method for the InP@ZnS@ZnO/NiO quantum dot, except that the core structure is InP.

Figure 8:
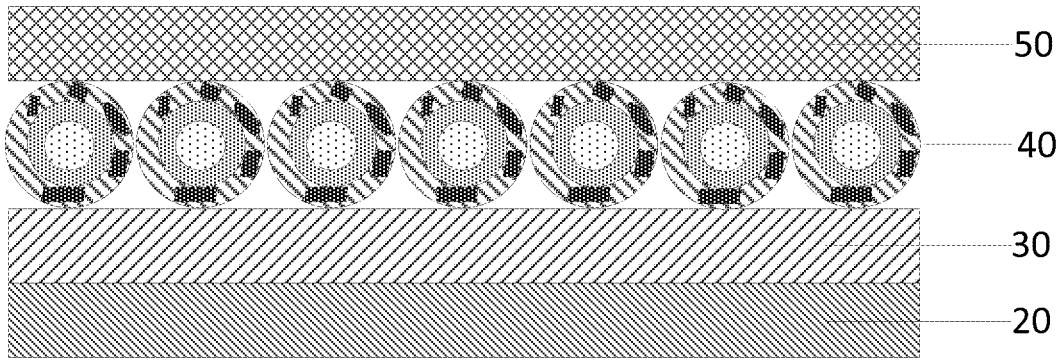
FIG. 8 is a schematic structural diagram of a quantum dot light-emitting device provided by an embodiment of the present disclosure.

Based on the same disclosure concept, an embodiment of the present disclosure further provides a quantum dot light-emitting device, as shown in FIG. 8, including an anode 20, a hole injection layer 30, a quantum dot light-emitting layer 40 and a cathode 50 which are arranged sequentially in a stacked mode. The quantum dot light-emitting layer 40 includes any above quantum dot provided by an embodiment of the present disclosure.

According to the above quantum dot light-emitting device provided by an embodiment of the present disclosure, the quantum dot light-emitting layer includes any one above quantum dot provided by an embodiment of the present disclosure, because a material of an outermost shell of the quantum dot includes an electron transport material and a hole transport material, on the one hand, an outermost electron transport material of the quantum dot may be used as an electron transport layer in a QLED device, and an outermost hole transport material of the quantum dot may be used as a hole transport layer in the QLED device, thereby reducing a process of making the electron transport layer and the hole transport layer separately, effectively simplifying a device structure and process, and avoiding damage to a previous film layer by a next film layer in a solution process. On the other hand, both the electron transport material and the hole transport material are in close contact with the quantum dot, thereby making injection of electrons and holes more efficient and effectively avoiding charge loss. In addition, the electron transport material and the hole transport material simultaneously make contact with the hole injection layer in the QLED device, but the holes may be preferentially injected into the hole transport material with a smaller potential barrier difference value, and then further injected into the quantum dot. Therefore, the outer-layer electron transport material may not block injection of the holes. Similarly, the electrons may be preferentially injected into the electron transport material with a smaller potential barrier difference value, and then further injected into the quantum dot. Therefore, the outer-layer hole transport material may not hinder injection of the electrons. In addition, injection efficiency of the electrons and the holes during work of the device may be flexibly adjusted by adjusting components of the electron transport material and the hole transport material, so that injection of the electrons and the holes is more balanced, thereby improving the efficiency of the device and prolonging the service life of the device.

Further, during specific implementation, in the above quantum dot light-emitting device provided by an embodiment of the present disclosure, the hole injection layer makes direct contact with the quantum dot light-emitting layer, so that the hole injection layer and the hole transport material can form a structure with a certain energy level gradient, which can maximize transmission efficiency of the holes and increase a utilization rate of carriers.

Further, during specific implementation, in the above quantum dot light-emitting device provided by an embodiment of the present disclosure, a material of the hole injection layer may include, but is not limited to, one or a combination of PEDOT:PSS, CuPc, a transition metal oxide, or metal chalcogenides. The transition metal oxide includes, but is not limited to, one or a combination of MoOx, VOx, WOx, CrOx and CuO, and the metal chalcogenides include, but is not limited to, one or a combination of $MoS_2$, $MoSe_2$, $WS_2$, $WSe_2$, and CuS.

Further, during specific implementation, in the above quantum dot light-emitting device provided by an embodiment of the present disclosure, the anode may be a doped metal oxide, and the doped metal oxide includes, but is not limited to, one or more of indium-doped tin oxide (ITO), indium-doped zinc oxide (IZO), or the like.

Further, during specific implementation, in the quantum dot light-emitting device provided by an embodiment of the present disclosure, the cathode may be one or more of a metal material, a conductive metal oxide material, and a conductive carbon material. The metal material includes, but is not limited to, one or more of Al, Ag, Cu, Mo, Au, or their alloys. The conductive metal oxide material includes, but is not limited to, one or more of ITO, IZO or AZO. The conductive carbon material includes, but is not limited to, one or more of a carbon nanotube, graphene, graphene oxide, or the like.

Further, during specific implementation, a cathode material is preferably Al, Ag, or Mg/Ag.

Further, during specific implementation, a thickness of the cathode may be 500 nm to 1000 nm.

Further, during specific implementation, a structure of the quantum dot light-emitting device provided by an embodiment of the present disclosure may be either an upright structure or an inverted structure, which is not limited.

A preparation method for the quantum dot light-emitting device of the upright structure provided by an embodiment of the present disclosure is illustrated in detail below through specific embodiments. The preparation method of each film layer in the quantum dot light-emitting device includes, but is not limited to, one or more of a spin coating method, an evaporation method, a chemical vapor deposition method, a physical vapor deposition method, a magnetron sputtering method, or the like.

Figure 9A:
FIG. 9A to FIG. 9D are schematic structural diagrams of a preparation method for a quantum dot light-emitting device of an upright structure provided by an embodiment of the present disclosure after executing each step.

(1) A base substrate 10 is cleaned, and a layer of anode 20 is evaporated on the base substrate 10 by using the evaporation method, as shown in FIG. 9A. The base substrate 10 may be a rigid substrate or a flexible substrate. The rigid substrate includes, but is not limited to, glass or the like. The flexible substrate includes, but is not limited to, one or more of polyethylene terephthalate (PET), polyethylene naphthalate (PEN), polyimide (PI), polyethylene (PE), polyvinyl chloride (PV), or the like.

Figure 9B:
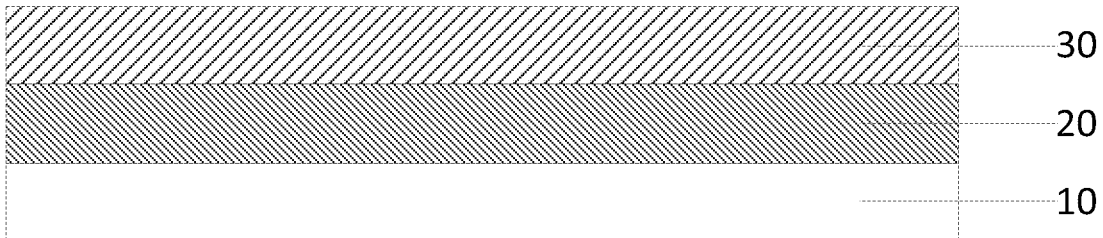

(2) A hole injection layer 30 is prepared on the anode 20 by using the spin coating method, as shown in FIG. 9B. For example, a PEDOT:PSS hole injection material is spin coated.

Figure 9C:
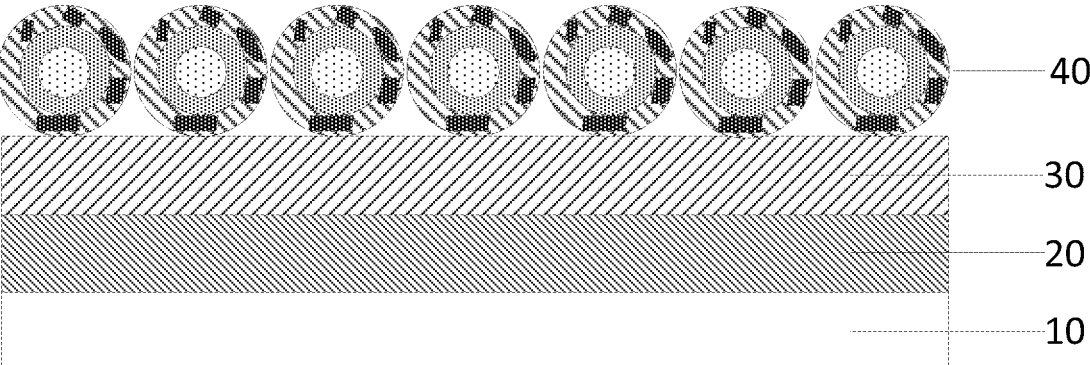

(3) A quantum dot light-emitting layer 40 is prepared on the hole injection layer 30 by using the spin coating method, as shown in FIG. 9C. The quantum dot light-emitting layer includes a CdSe@ZnS@ZnO/NiO quantum dot light-emitting layer provided by an embodiment of the present disclosure, for example, ZnO is an electron transport material, and NiO is a hole transport material.

Figure 9D:
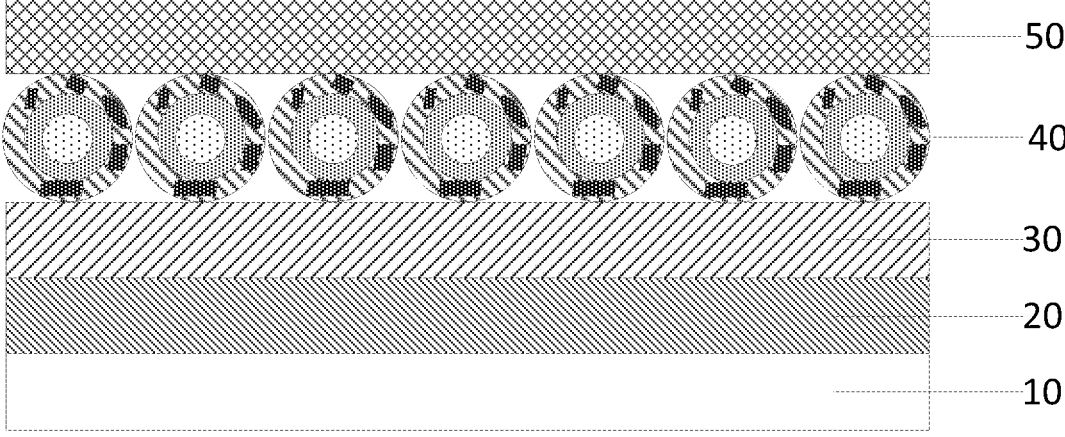

(4) A layer of cathode 50 is evaporated on the quantum dot light-emitting layer 40 by using the evaporation method, as shown in FIG. 9D. A material of the cathode may be Al or the like, with a thickness of about 500 nm-1000 nm.

After the preparation of each of the above film layers is completed, encapsulation is performed to complete the preparation of the quantum dot light-emitting device of the upright structure in an embodiment of the present disclosure.

Figure 10:
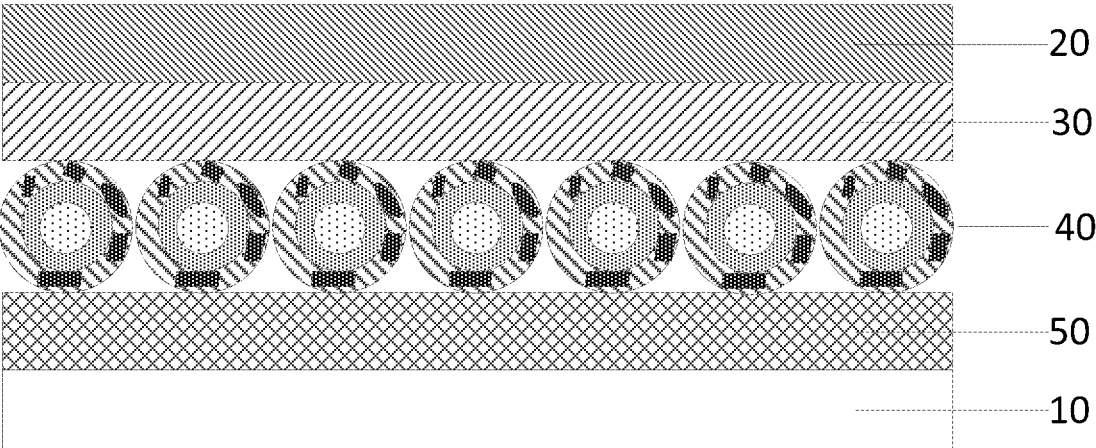
FIG. 10 is a schematic structural diagram of a quantum dot light-emitting device of an inverted structure provided by an embodiment of the present disclosure.

The quantum dot light-emitting device shown in FIG. 9D obtained by the above preparation in an embodiment of the present disclosure is of the upright structure. Certainly, during specific implementation, a quantum dot light-emitting device of an inverted structure may also be prepared. The quantum dot light emitting device of the inverted structure is to sequentially form the cathode 50, the quantum dot light-emitting layer 40, the hole injection layer 30, and the anode 20 on the base substrate 10. The specific structure of the inverted structure is shown in FIG. 10. For a specific preparation flow of the quantum dot light-emitting device of the inverted structure, please refer to the above preparation method for the quantum dot light-emitting device of the upright structure. Only the preparation sequence of each film layer changes, which will not be detailed here.

Light-emitting types of the quantum dot light-emitting device are not limited in the present disclosure, for example, are not limited to bottom light emitting or top light emitting. During specific implementation, an electrode located at a light-emitting side of the quantum dot light-emitting device in the anode and the cathode is a transparent electrode.

During specific implementation, the quantum dot light-emitting device provided by an embodiment of the present disclosure further includes other functional film layers well known to those skilled in the art, which is not detailed here.

Based on the same disclosure concept, an embodiment of the present disclosure further provides a display apparatus, including the above quantum dot light-emitting device provided by an embodiment of the present disclosure. The display apparatus may be any product or component with a display function, such as a mobile phone, a tablet computer, a television, a displayer, a notebook computer, a digital photo frame, and a navigator. It should be understood by those ordinarily skilled in the art that the display apparatus should have other essential constituent parts, which is not repeated here and should not be regarded as a limitation to the present disclosure. Principles of the display apparatus for solving the problems are similar to those of the aforementioned quantum dot light-emitting device, therefore, implementation of the display apparatus may refer to that of the aforementioned quantum dot light-emitting device, and repetitions are omitted.

According to the quantum dot and the preparation method therefor, the quantum dot light-emitting device, and the display apparatus provided by embodiments of the present disclosure, because the material of the outermost shell of the quantum dot includes the electron transport material and the hole transport material, in this way, the quantum dot with this structure can be applied to preparation of the QLED device. On the one hand, the outermost electron transport material of the quantum dot may be used as the electron transport layer in the QLED device, and the outermost hole transport material of the quantum dot may be used as the hole transport layer in the QLED device, thereby reducing the process of making the electron transport layer and the hole transport layer separately, effectively simplifying the device structure and process, and avoiding damage to the previous film layer by the next film layer in the solution process. On the other hand, both the electron transport material and the hole transport material are in close contact with the quantum dot, thereby making injection of electrons and holes more efficient and effectively avoiding charge loss. In addition, the electron transport material and the hole transport material simultaneously make contact with the hole injection layer in the QLED device, but the holes may be preferentially injected into the hole transport material with the smaller potential barrier difference, and then further injected into the quantum dot. Therefore, the outer-layer electron transport material may not block injection of the holes. Similarly, the electrons may be preferentially injected into the electron transport material with the smaller potential barrier difference, and then further injected into the quantum dot. Therefore, the outer-layer hole transport material may not hinder injection of the electrons. In addition, injection efficiency of the electrons and the holes during work of the device may be flexibly adjusted by adjusting components of the electron transport material and the hole transport material, so that injection of the electrons and the holes is more balanced, thereby improving the efficiency of the device and prolonging the service life of the device.

Although embodiments of the present disclosure have been described, those skilled in the art can make additional alterations and modifications to these embodiments once they know the basic creative concept. Therefore, the appended claims intend to be explained as including embodiments and all alterations and modifications falling within the scope of the present disclosure.

Apparently, those skilled in the art can make various modifications and variations to embodiments of the present disclosure without departing from the spirit and scope of embodiments of the present disclosure. In this way, if these modifications and variations of embodiments of the present disclosure fall within the scope of the claims of the present disclosure and their equivalent art, the present disclosure also intends to include these modifications and variations.

What is claimed is:

1. A quantum dot, comprising a core structure and a shell structure surrounding the core structure, wherein a material of an outermost shell in the shell structure comprises an electron transport material and a hole transport material, and the outermost shell constitutes an outermost layer of the quantum dot;

wherein the outermost shell comprises a plurality of electron transport material grains and a plurality of hole transport material grains, and the electron transport material grains and the hole transport material grains are dispersed and spaced with each other.

2. The quantum dot according to claim 1, wherein the shell structure comprises the outermost shell and an inner shell located between the outermost shell and the core structure.

3. The quantum dot according to claim 2, wherein a material of the inner shell comprises a binary compound semiconductor material.

4. The quantum dot according to claim 3, wherein the material of the inner shell comprises one or a combination of ZnS, ZnSe, CdS or CdSe.

5. The quantum dot according to claim 1, wherein the electron transport material is an inorganic material, and/or, the hole transport material is an inorganic material.

6. The quantum dot according to claim 5, wherein when the electron transport material is the inorganic material, the electron transport material comprises one or a combination of $ZnO$, $Al_2O_3$, $TiO_2$, $ZrO_2$, $SnO_2$, $Nb_2O_5$, or $In_2O_3$; and/or, when the hole transport material is the inorganic material, the hole transport material comprises one or a combination of nickel oxide, tungsten oxide, molybdenum oxide, vanadium oxide, or chromium oxide.

7. The quantum dot according to claim 1, wherein a thickness of the outermost shell is 1 nm to 100 nm.

8. A quantum dot, comprising a core structure and a shell structure surrounding the core structure, wherein a material of an outermost shell in the shell structure comprises an electron transport material and a hole transport material; the outermost shell comprises a plurality of electron transport material grains and a plurality of hole transport material grains, and the electron transport material grains and the hole transport material grains are dispersed and spaced with each other.

9. A quantum dot light-emitting device, comprising an anode, a hole injection layer, a quantum dot light-emitting layer and a cathode arranged sequentially in a stacked mode, wherein the quantum dot light-emitting layer comprises the quantum dot according to claim 8.

10. The quantum dot light-emitting device according to claim 9, wherein the hole injection layer is in direct contact with the quantum dot light-emitting layer.

11. A display apparatus, comprising the quantum dot light-emitting device according to claim 9.

12. A preparation method for the quantum dot according to claim 8, comprising:

providing an original quantum dot comprising the core structure and an original shell surrounding the core structure; and processing the original shell to form the shell structure surrounding the core structure; wherein the material of the outermost shell in the shell structure comprises the electron transport material and the hole transport material; the outermost shell comprises the plurality of electron transport material grains and the plurality of hole transport material grains, and the electron transport material grains and the hole transport material grains are dispersed and spaced with each other.

13. The preparation method according to claim 12, wherein the processing the original shell to form the shell structure surrounding the core structure comprises:

partially oxidizing the original shell to form an oxide shell on a surface of the original shell, and an inner shell located between the oxide shell and the core structure; and performing partial ion exchange on the oxide shell to form the outermost shell with the material comprising the electron transport material and the hole transport material.

14. The preparation method according to claim 13, wherein the performing partial ion exchange on the oxide shell comprises:

introducing an exchange reagent of a cation and a ligand into a solution of the quantum dot comprising the oxide shell to achieve partial ion exchange through strength of a coordination capability between the ligand and the cation.

15. The quantum dot according to claim 8, wherein the shell structure comprises the outermost shell and an inner shell located between the outermost shell and the core structure.

16. The quantum dot according to claim 15, wherein a material of the inner shell comprises a binary compound semiconductor material.

17. The quantum dot according to claim 16, wherein the material of the inner shell comprises one or a combination of ZnS, ZnSe, CdS or CdSe.

18. The quantum dot according to claim 8, wherein the electron transport material is an inorganic material, and/or, the hole transport material is an inorganic material.

19. The quantum dot according to claim 18, wherein when the electron transport material is the inorganic material, the electron transport material comprises one or a combination of $ZnO$, $Al_2O_3$, $TiO_2$, $ZrO_2$, $SnO_2$, $Nb_2O_5$, or $In_2O_3$; and/or, when the hole transport material is the inorganic material, the hole transport material comprises one or a combination of nickel oxide, tungsten oxide, molybdenum oxide, vanadium oxide, or chromium oxide.

20. The quantum dot according to claim 8, wherein a thickness of the outermost shell is 1 nm to 100 nm.

* * * * *